United States Patent [19]

Chao et al.

[11] Patent Number: 5,320,737

[45] Date of Patent: Jun. 14, 1994

[54] TREATMENT TO REDUCE SOLDER PLATING WHISKER FORMATION

[75] Inventors: Chung-Yao Chao; Julius Fister, both of Hamden, Conn.

[73] Assignee: Olin Corporation, New Haven, Conn.

[21] Appl. No.: 391,754

[22] Filed: Aug. 10, 1989

[51] Int. Cl.$^5$ ............................................. C25D 5/34
[52] U.S. Cl. .................................. 205/183; 205/215; 205/254
[58] Field of Search ..................... 204/29, 32.1, 35.1, 204/44.4; 205/184, 215, 254

[56] References Cited

U.S. PATENT DOCUMENTS

| | | | |
|---|---|---|---|
| 3,518,168 | 6/1970 | Byler | 204/32 |
| 4,589,962 | 5/1986 | Sajja et al. | 204/15 |
| 4,599,149 | 7/1986 | Nobel et al. | 204/44.4 |
| 4,662,999 | 5/1987 | Opaskar et al. | 204/44.4 |
| 4,749,626 | 6/1988 | Kadija et al. | 428/647 |

OTHER PUBLICATIONS

H. Silman et al., Protective and Decorative Coatings for Metals, Finishing Publications, Ltd., Teddington, Middlesex, England, 1978, pp. 123–132, 147–151.

Metal Finishing Guidebook and Directory for 1975, Metals and Plastics Publications, Inc., Hackensack, N.J., pp. 146–147.

*Primary Examiner*—John Niebling
*Assistant Examiner*—William T. Leader
*Attorney, Agent, or Firm*—Gregory S. Rosenblatt; H. Samuel Kieser

[57] ABSTRACT

The formation of whiskers during tin or tin-lead solder electroplating of a copper base alloy substrate in a methane sulfonate solder plating bath is inhibited by passivating the surface of the substrate prior to electroplating. Preferred passivating solutions include an aqueous solution of sodium dichromate and phosphoric acid, and an aqueous solution of chromic acid and phosphoric acid. Passivation is preferably followed by treatment with a basic solution having a pH of at least 8.

4 Claims, No Drawings

TREATMENT TO REDUCE SOLDER PLATING WHISKER FORMATION

This invention relates generally to a treatment for reducing the whisker formation during solder plating. More particularly, this invention relates to a passivation and conditioning treatment to reduce solder whiskers that develop on copper alloy based materials during electroplating in a solder bath.

Various copper alloy devices are plated with solder to enhance their solderability in the final package. This is particularly true of leadframe devices used in surface mounted packages. By precoating with solder, solderability of the package containing the leadframes to the printed circuit board is enhanced. Typically, leadframes may be fabricated from such copper alloys as alloy C-151 which is a copper-zirconium alloy and alloy C-194 which is a copper-iron alloy having additions of zinc and phosphorus. Copper alloy C-151 comprises from about 0.05% to about 0.15% zirconium, up to about 0.005% Al, up to about 0.005% Mn and the balance essentially copper. Copper alloy C-194 comprises from about 2.1% to about 2.6% iron, from about 0.05% to about 0.20% zinc, from about 0.01% to about 0.04% phosphorus, and the remainder essentially copper. Additionally, leadframes may be fabricated from copper, nickel, silicon alloys such as Cu-3Ni-2Si. In the past, the solder was applied by electroplating in a fluoroborate type bath.

The fluoroborate solution was found to be somewhat corrosive and a new plating solution has been developed which is less corrosive than the fluoroborate solution. The new solution is a sulfonate solution sold under the trade name "Technic-Solder NF". These types of solder baths are known as the methane sulfonate type. One typical composition known as NF 80/20 (80% Sn, 20% Pb) is an aqueous-based solution containing 4.9% stannous methane sulfonate ($C_2H_6S_2O_6Sn$), 0.5% lead methane sulfonate ($C_2H_6S_2O_6Pb$), and 11.34% methane sulfonate acid ($CH_4SO_3$). Other types of solutions include NF 90/10 and NF 60/40.

When certain copper-based alloys such as C-151 and C-194 are solder plated using the methane sulfonate type bath, whiskers tend to develop on the surface of the leadframe or other parts being plated. These whiskers are hair-like projections extending from the surface and may be either straight or curled or bent. The presence of such whiskers is undesirable, especially in the case of leadframes, wherein the whiskers can cause a short between the legs of the leadframe.

Accordingly, it is an object of the present invention to provide a method for reducing the formation of whiskers during the solder plating of copper base alloys.

More specifically, it is an object of the present invention to provide a treatment for copper base alloys which is applied prior to solder plating in a methane sulfonate type solder bath.

These and other objects and advantages of the present invention may be achieved in accordance with the present invention by providing a surface treatment which substantially reduces or eliminates the formation of whiskers during electrolytic plating utilizing the methane sulfonate type of solder bath. One such treatment involves chemically treating articles made from a copper-base alloy with a descale solution for at least over 30 seconds. In the case of such treatment, it is preferred that the solution not be contaminated by dissolved copper. According to another embodiment, the articles are treated with a source of chromate ions in an aqueous acidic solution. According to yet another embodiment, the copper base alloy has its surface passivated by treatment with an aqueous inorganic acidic solution such as chromic acid, sulfuric acid, phosphoric acid, and mixtures thereof. This treatment is followed by solder plating.

To illustrate the problem encountered with the use of the tin-lead electroplating solution of the methane sulfonate type, samples of copper alloy C-151 were mechanically polished with various polishing media prior to solder plating with the NF 80/20 tin-lead electroplating solution as described above. The plating was conducted at 10 mA/cm² for 15 minutes, producing a 300 microinch thick solder coating. The frequency of whiskers is set forth in Table 1 below. As will be noted, the frequency of the whiskers ranges from 30 per square inch up to 90 per square inch depending upon the particular type of polishing medium. The table also shows that the surface texture change by polishing has an effect upon whisker formation.

TABLE 1

| Polishing Medium | Whisker Frequency |
| --- | --- |
| 600 grit SiC paper | 30/in² |
| 6u diamond paste | 30/in² |
| 0.05u Al₂O₃ | 90/in² |

According to one aspect of the present invention, the copper base alloy leadframes are chemically treated with a commercially used descale solution. An example of one such solution is 45% $H_2SO_4$, 5% $HNO_3$, and 50% $H_2O$. The time of such treatment should be at least over 30 seconds and preferably between 60 and 120 seconds. The temperature is preferably room temperature. By way of example, copper alloy C-151 samples were chemically treated by immersion in the chemical descale solution mentioned above (45% $H_2SO_4$, 5% $HNO_3$, 50% $H_2O$) for various times at room temperature. The samples were subsequently solder plated in the NF 80/20 plating bath mentioned above at a current density of 10 mA/cm² for 15 minutes as in the previous example. The frequency of whiskers for the various acid treatment times are set forth in Table 2. As will be noted, after 30 seconds, the frequency of whiskers substantially decreased.

TABLE 2

| Acid Treatment Time | Whisker Frequency |
| --- | --- |
| 0 Sec. | 60/in² |
| 15 Sec. | 10/in² |
| 30 Sec. | 10/in² |
| 60 Sec. | 0–1/in² |
| 90 Sec. | 0–1 in² |
| 120 Sec. | 1/in² |

When treating with a descale solution to prevent whisker formation during solder plating, it is important that the copper not be allowed to migrate into the solution. That is, the solution should not be reused too many times so that copper builds up in the solution. This is illustrated by the following example. Copper alloy C-151 samples were chemically treated for 60 seconds in the same acid descale mixture mentioned above, but which contained various amounts of copper to simulate copper loading typically encountered in service. The results are shown in Table 3. As will be noted, the whisker frequency with 6 g/l of copper in the acid mixture was extremely high, thereby indicating the desirability of maintaining the mixture substantially copper free.

TABLE 3

| Copper Content in The Acid Mixture | Whisker Frequency |
|---|---|
| 6 g/l | 150/in$^2$ |
| 12 g/l | >200/in$^2$ |
| 18 g/l | >200/in$^2$ |

Another method found to reduce or substantially eliminate the generation of whiskers due to solder plating with the methane sulfonate type solder bath is to apply a passivation treatment to the surface prior to the solder plating. According to one such treatment, the copper alloy part is immersed in a solution containing chromate ions followed by immersion in a basic solution. One suitable solution is an aqueous mixture of sodium dichromate and phosphoric acid. Such solution may comprise about 1 to about 50 g/l sodium dichromate ($Na_2Cr_2O_7$) and about 1 to about 50% phosphoric acid ($H_3PO_4$). A preferred range is 10 to 30 g/l sodium dichromate and about 10% to 40% phosphoric acid.

The time of such immersion may be for at least about 1 second and preferably about 15 seconds to about one minute. The temperature of the bath is preferably ambient, although other temperatures may be used, if desired.

The immersion in the sodium dichromate/phosphoric acid solution is preferably followed by immersion in a basic solution which serves to help set the passivation procedure. Such basic solutions in accordance with the present invention comprise aqueous solutions having a pH of at least 8. Solutions of particular benefit are those having a pH in the range of about 9 to 11.5. Any suitable addition agent may be employed to adjust the pH of the solution. Generally, the addition will be selected from the group consisting of the salts of alkali metals, the salts of alkaline earth metals, the hydroxides of alkali metals, and the hydroxides of the alkaline earth metals. A preferred addition agent is one selected from the group consisting of sodium hydroxide, calcium hydroxide, potassium hydroxide, and ammonium hydroxide. The temperature of the basic solution may be maintained at a temperature from room temperature to about 100° C. and it is preferably maintained between 75° to 95° C. The time of immersion of the article or part in the basic solution may vary from 1 second to about 120 seconds, most preferably for about 5 seconds to about 60 seconds. After immersion in the basic solution, the article or part is dried by any conventional means and then plated.

By way of an example, samples of a copper alloy C-151 were immersed for 30 seconds in a solution containing 22 g/l sodium dichromate and 35% phosphoric acid followed by a 5 to 10 second immersion in a 100 ppm aqueous sodium hydroxide solution. Subsequent solder plating, utilizing the NF 80/20 plating bath as described above generated 0 to 1 whisker per square inch on the surface.

Other types of passivation solutions may be used. These include the use of a chromic acid/sulfuric acid solution which may contain chromic acid in the concentration of about 0.02 g/l to about 5.0 g/l and sulfuric acid in the concentration range of about 0.02 g/l to about 20 g/l depending upon the temperature and length of time of treatment. Preferably, this solution may consist essentially of about 0.1 g/l to about 0.3 g/l of chromic acid and from about 0.02 g/l to about 0.7 g/l sulfuric acid, and the balance essentially water.

Another solution, which may be used, is a dilute aqueous chromic acid/phosphoric acid solution. Solutions in accordance with this embodiment contain chromic acid in a concentration of about 0.002 g/l to about 50.0 g/l and phosphoric acid in a concentration in the range of about 0.002 g/l to about 10 g/l. The solution preferably has a concentration of chromic acid in the range of about 0.01 g/l to about 0.3 g/l and a concentration of phosphoric acid in the range of about 0.1 g/l to about 0.7 g/l.

It is apparent that there has been provided in accordance with this invention, a treatment for copper alloy leadframes or the like which is able to reduce the number of whiskers formed per unit area a significant amount when the part is solder plated using a methane sulfonate type solder bath.

While the invention has been described above in combination with specific embodiments thereof, it is evident many alterations, modifications, and variations will be apparent to those skilled in the art in light of the foregoing description. Accordingly, it is intended to embrace all such alterations, modifications, and variations that fall within the spirit and broad scope of the pending claims.

What is claimed is:

1. A method of inhibiting the formation of whiskers during tin or tin/lead solder plating of a copper base alloy material comprising passivating the surface of said material with a passivating aqueous solution to inhibit the formation of whiskers, wherein said solution comprises from about 1 to about 50 g/l sodium dichromate and from about 1% to about 50% phosphoric acid, applying an aqueous rinse solution having a pH greater than 8 to said material after passivation, and thereafter electroplating said material in a methane sulfonate solder bath to form a coating of solder thereon which is substantially whisker free.

2. The method of claim 1 wherein said solution comprises from about 10 to about 30 g/l sodium dichromate and from about 10% to about 40% phosphoric acid.

3. A method of inhibiting the formation of whiskers during tin or tin/lead solder plating of a copper base alloy material comprising passivating the surface of said material with a passivating solution to inhibit the formation of whiskers, wherein said solution is an aqueous solution of chromic acid and phosphoric acid, the concentration of said chromic acid being in the range of from about 0.002 to about 50.0 g/l, and the concentration of said phosphoric acid being in the range of from about 0.002 to about 10 g/l, applying an aqueous rinse solution having a pH greater than 8 to said material after passivation, and thereafter electroplating said material in a methane sulfonate solder bath to form a coating of solder thereon which is substantially whisker free.

4. The method of claim 3 wherein said concentration of chromic acid is from about 0.1 to about 0.3 g/l, and the concentration of phosphoric acid is from about 0.1 to about 0.7 g/l.

* * * * *